United States Patent
Carey et al.

(10) Patent No.: US 6,277,696 B1
(45) Date of Patent: Aug. 21, 2001

(54) SURFACE EMITTING LASER USING TWO WAFER BONDED MIRRORS

(75) Inventors: Kent W. Carey, Palo Alto; Long Yang, Union City; John E. Bowers; Dubravko I. Babic, both of Santa Barbara; James J. Dudley, Sunnyvale, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 08/751,038

(22) Filed: Nov. 15, 1996

Related U.S. Application Data

(63) Continuation of application No. 08/495,150, filed on Jun. 27, 1995, now abandoned.

(51) Int. Cl.[7] .................................................. H01L 21/20
(52) U.S. Cl. .......................... 438/289; 438/246; 438/287; 438/485
(58) Field of Search ................................... 438/485, 292, 438/287, 289, 246

(56) References Cited

U.S. PATENT DOCUMENTS

| | | | |
|---|---|---|---|
| 5,013,681 | * 5/1991 | Godbey et al. | 437/86 |
| 5,376,579 | * 12/1994 | Annamalai | 437/974 |
| 5,376,580 | 12/1994 | Kish et al. | 437/127 |
| 5,395,788 | * 3/1995 | Abe et al. | 437/974 |
| 5,449,659 | * 9/1995 | Garrison et al. | 437/974 |
| 5,455,202 | * 10/1995 | Mahloy et al. | 437/974 |

OTHER PUBLICATIONS

James J. Dudley, Wafer Fused Vertical Cavity Lasers, Aug. 1994, University of California, Santa Barbara, complete document, cover page +pp. ii–176.

T. Baba, et al., "Continuous Wave GaInAsP/InP Surface Emitting Lasers with a Thermally Conductive MgO/Si Mirror", Jpn. J, Appl. Phys., vol. 33 (1994), pp. 1905–1909.

Babic', et al., "Optically Pumped All–Epitaxial Wafer–fused 1.52 um Vertical Cavity Lasers", Electronic Letters, Apr. 28, 1994, vol. 30, No. 9.

Dudley, et al., "Low Threshold Wafer Fused Long Wavelength Vertical Cavity Lasers," Applied Physics Letters, vol. 64, No. 12, 1463–5, Mar. 21, 1994.

* cited by examiner

*Primary Examiner*—Robert Kunemund
(74) *Attorney, Agent, or Firm*—Denise A. Lee

(57) ABSTRACT

The present invention provides a vertical cavity surface emitting laser having high gain and high reflectivity in the desired wavelength range and good thermal and electrical conductivity. The laser structure is comprised of a first mirror region, a second mirror region, and an active region positioned between the first and second mirror regions. Unlike, prior VCSELs, the active region is fused to both the first mirror region and the second mirror region. This allows the laser designer to optimize laser performance for the desired wavelength range by allowing the choice of different materials for the first mirror region, the second mirror region, and the active region.

10 Claims, 8 Drawing Sheets

SURFACE EMITTING LASER USING TWO WAFER BONDED MIRRORS

CROSS REFERENCE TO RELATED APPLICATION

This is a continuation of copending application Ser. No. 08/495,150 filed on Jun. 27, 1995, now abandoned.

This invention was made with Government Support under Contract No. F19628-92-K-004, awarded by the Air Force Office of Scientific Research. The Government has certain rights in this invention.

BACKGROUND OF THE INVENTION

Vertical cavity surface emitting lasers capable of emitting long wavelengths are of interest in optical communication systems. In particular, emission of light having wavelengths near 1.3 μm and 1.5 μm has wide applications in fiber optic communications. Unfortunately, for a given wavelength, materials ideal for formation of the gain region of a vertical cavity surface emitting laser (VCSEL) are not always ideally suited for formation of the mirror regions of the VCSEL. For example, for light emission in the 1.2 μm to 1.6 μm wavelength range, the material which can be grown lattice matched to indium phosphide (InP) is ideal for gain region formation. However, material which is lattice matched to indium phosphide is undesirable for VCSEL mirror formation since it does not provide high reflectivity in the 1.2 μm to 1.5 μm wavelength range. Similarly, while the material lattice-matched to GaAs substrates makes highly reflective mirrors, it is not a good material choice for VCSEL gain region formation in the 1.3 μm and 1.6 μm wavelength range.

The reference "Continuous Wave GaInAsP/InP Surface Emitting Lasers with a Thermally Conductive MgO/Si Mirror", T. Baba, et al, Jpn. J, Appl. Phys., Vol. 33 (1994), pp. 1905–1909, describes a VCSEL which uses different materials for the gain region and mirror region formation. FIG. 1 shows an etched well VCSEL 100 such as is described in Baba, et al. The etched well VCSEL 100 shown in FIG. 1 is comprised of a gain region 102 formed on an indium phosphide substrate 104, an n-side mirror region 112 comprised of six pairs of SiO$_2$/Si layers, and a p-side mirror region 110 comprised of 8.5 pairs of (MgO/Si) layers. The mirror regions 110, 112 are formed by depositing dielectric films on the active region 102 and the indium phosphide substrate 104, respectively. Although, the dielectric mirror regions 110 and 112 provide high reflectivity which could not be accomplished by using semiconductor layers lattice-matched to an indium phosphide substrate, the dielectric mirrors 110, 112 provide poor thermal and no electrical conduction. Poor electrical and thermal conductivity of the mirror regions results in overheating of the VCSEL, negatively impacting device performance characteristics.

Alternatively, different materials for manufacture of the gain region and mirror regions of a VCSEL may be integrated by fusing a second mirror region material to a first material used for gain region formation. The gain region being previously deposited on the first mirror region using deposition techniques well known in the art. One example of such a structure is shown in the article by Babic', et al., "Optically Pumped all-epitaxial wafer-fused 1.52 μm vertical cavity lasers," Electronic Letters, Apr. 28, 1994, Vol. 30, No. 9. Although the semiconductor mirror regions of the VCSEL structure described in Babic', et al. offer improved thermal and electrical conductivity compared to the insulating dielectric mirrors 110, 112 of Baba, et al., the Babic' laser is difficult to manufacture. Although the Babic' laser design is useable for operating at 1.5 μm, it is probably not capable of CW high power operation at 1.3 μm.

Another example of fusing a first mirror region comprised of a first material to a second material for forming the gain region comprised of a different material is described in the reference "Low Threshold Wafer Fused Long Wavelength Vertical Cavity Lasers," by Dudley, et al., Applied Physics Letters, Vol. 64, No. 12, 1463–5, Mar. 21, 1994. FIG. 2 shows a single fused VCSEL 200 as described by Dudley, et al. The VCSEL described in Dudley, et al. combines a semiconductor mirror region 212 with an alternating semiconductor/dielectric mirror region 210. Although the semiconductor mirror 212 offers improved thermal and electrical conductivity compared to the insulating dielectric mirror 112 shown in FIG. 1, the VCSEL 200 shown in FIG. 2 still has poor thermal and electrical conductivity through dielectric mirror 210. Further, the laser shown in FIG. 2 injects current at the edge of the device. Injecting current at the device edge instead of through the center of the device causes an increase the heat generated, decreasing laser performance. The laser performance is also decreased due to the poor overlap of the carrier profile and the optical mode profile. This could cause the laser to operate in multiple transverse modes which is a problem for communication systems and for stable fiber optic coupling.

An example of using wafer bonding techniques for LED formation is shown in U.S. Pat. No. 5,376,580. Referring to FIG. 8 of U.S. Pat. No. 5,376,580, for example, shows wafer bonding a first growth substrate 30 and a second substrate 48 to epitaxial layers 32–38. Wafer bonding for LED formation is typically used to bond a substrate material that is optically transparent to a LED active region formed of a different material.

A top or bottom emitting VCSEL in the 1.3 μm and 1.5 μm wavelength range which provides a high gain, high reflectivity, good thermal conductivity and good electrical conduction through both mirrors is needed.

SUMMARY OF THE INVENTION

The present invention provides an optoelectronic device, specifically a vertical cavity surface emitting laser having high gain and high reflectivity in the desired wavelength range and good thermal and electrical conductivity. The laser structure is comprised of a first mirror region, a second mirror region, and an active region positioned between the first and second mirror regions. Unlike, prior VCSELs, the active region is fused to both the first mirror region and the second mirror region. This allows the laser designer to optimize laser performance for the desired wavelength range by allowing the choice of different materials for the first mirror region, the second mirror region, and the active region.

In the preferred embodiment the VCSEL structure has electrodes formed on the top surface of the second mirror region and the bottom surface of the substrate. The first electrode, being placed in close proximity to the gain region, can more easily withdraw heat generated in the laser. Efficient heat removal is beneficial since many of the characteristics of the VCSEL deteriorate with increased temperature.

The method of making the optoelectronic device according to the present invention includes the steps of: forming a first region on a first substrate, the first region being comprised of a first material lattice-matched to the first substrate, the first material having a first lattice parameter; forming a second region on the first major surface of a second substrate, the second region being comprised of a second material lattice-matched to the second substrate, the second material having a second lattice parameter different than the first lattice parameter; forming a third region on the first major surface of a third substrate, the third region being comprised of a third material having a lattice parameter different than the second lattice parameter; fusing the first region to the second region and removing the second substrate; and fusing the second region to the third region and removing the third substrate. In the case of a vertical cavity surface emitting laser the first and third regions are highly reflective mirror regions and the second region is an active region.

A further understanding of the nature and advantages of the present invention may be realized with reference to the remaining portions of the specification and the attached drawings.

DETAILED DESCRIPTION OF THE PREFERRED EMBODIMENT

Figure 1:
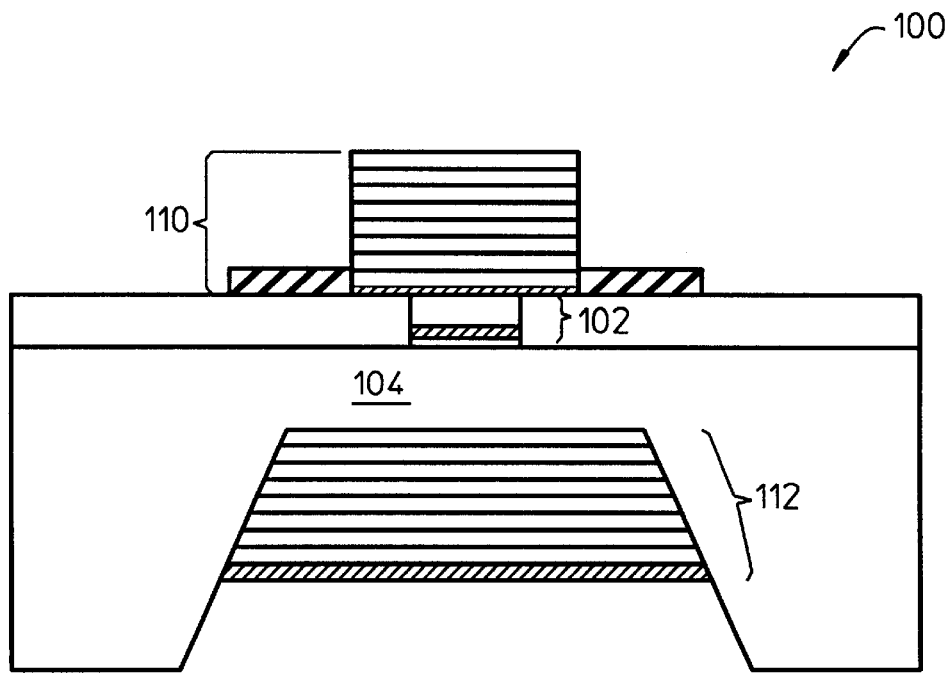
FIG. 1 shows an etched wall top emitting vertical cavity surface emitting laser.
Figure 2:
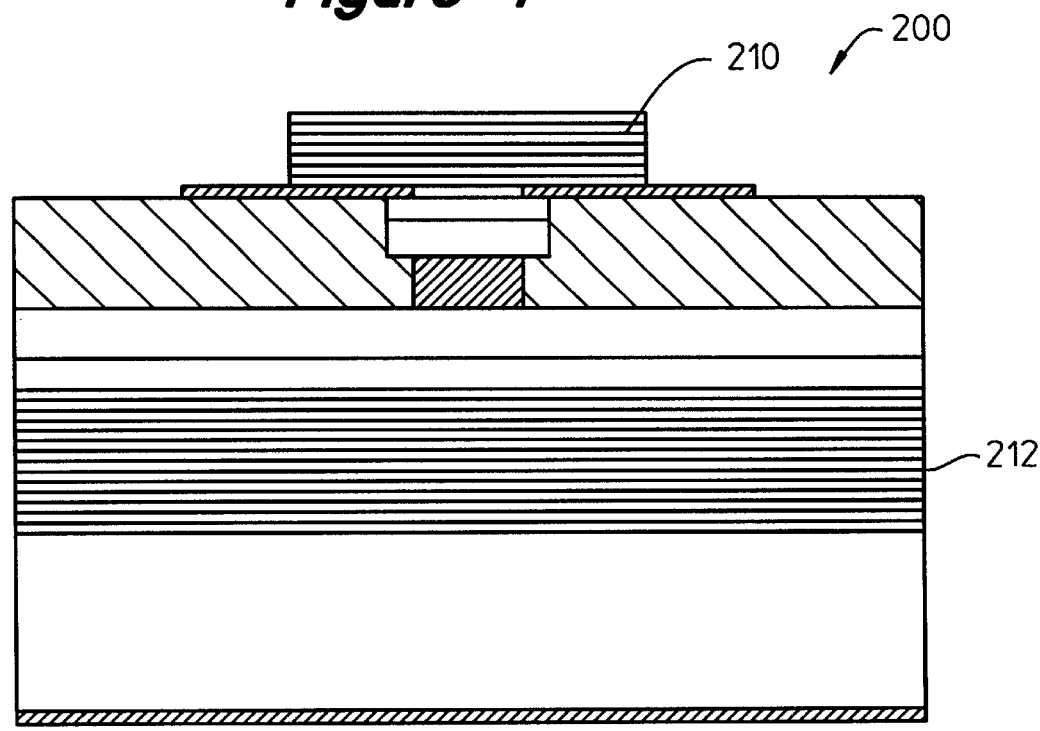
FIG. 2 shows a vertical cavity surface emitting laser having a mirror region comprised of a first material fused to the active region formed from a different material.

Referring to FIG. 3, the present invention provides a vertical cavity surface emitting laser 300 comprised of a first mirror region 302, a second mirror region 304 and an active region 306. The active region 306 has a first major surface 308 and the second major surface 310. Unlike previous VCSELs, the present invention fuses both the first major surface 308 and the second major surface 310 of the active region to the first and second mirror regions 302, 304. Specifically, the first major surface 308 of the active region 306 is fused to the first major surface 312 of the first mirror region 302 and the second major surface 310 of the active region 306 is fused to the first major surfaces 314 of the second mirror region 304.

Although any number of materials may be used for formation of the mirror regions 302, 304, the mirror regions 302, 304 are preferably made of a semiconductor material having a high reflectivity in the desired wavelength range and good thermal and electrical conductivity. Similarly, the material used for formation of the active region 306 is preferably a semiconductor material having high optical gain, a low transparency threshold current density, and high reliability in the desired wavelength range. In the preferred embodiment, the material from which the first mirror region 302 is formed is lattice-matched to a substrate crystal with a different lattice parameter than the substrate crystal to which the active region 306 is lattice-matched. The material chosen for formation of the mirror regions 302, 304 or the active region 306 may be any material which allows high quality epitaxial growth.

Although a number of materials may be used, in the preferred embodiment the first mirror region 302 is comprised of a plurality of alternating pairs of n-doped GaAs/AlAs (gallium arsenide/aluminum arsenide) quarter-wavelength thick layers epitaxially grown on a gallium arsenide substrate 316. Typically, the n-mirror region 302 consists of 20 to 30 periods of alternating n-type GaAs/AlAs quarter-wave layers. The interface between the layers may be graded in alloy composition or using an AlAs/GaAs/$Al_{0.3}Ga_{0.7}As$ variable duty cycle short period superlattice ("SPSL"). The grading reduces any heterojunction band discontinuity at the GaAs interface.

The active region 306 includes a gain region 317 and typically also includes first and second cladding layers 318, 320 which sandwich the gain region 317. The gain region 317 is typically constructed of one or more quantum wells of InGaAsP. Alternative materials such as InAlGaAs, InGaAsSb, GaAs, InGaAs, InGaP, HgCdTe, PbSnTe, ZnSSe, GaAlAs, and InGaAlP may be used for construction of the gain region. In the embodiment shown in FIG. 3, the first cladding layer 318 is n-doped and the second cladding layer 320 is p-doped. In the preferred embodiment the cladding regions are comprised of InP although alternative materials such as any of the materials listed above, Si or SiGe may be used. The first cladding layer 318 has a first major surface 321 and a second major surface 322, the first major surface 321 of the first cladding layer 318 being fused to the first major surface 312 of the first mirror region 302 and the second major surface 322 of the first cladding layer 318 positioned next to the gain region 317. The second cladding layer 320 has a first major surface 323 and a second major surface 325, the first major surface 325 of the second cladding layer 320 being fused to the first major surface 314 of the second mirror region 304 and the second major surface 325 of the second cladding layer 320 positioned next to the gain region 317.

Similar to the first mirror region 302, the second mirror region 304 is typically comprised of alternating quarter-wave layers of GaAs/AlAs. However, the second mirror region should have a conductivity type opposite to that of the first mirror region, in this case p-doped. The second mirror region 304 may also contain proton isolation regions 324 for more efficient current channeling and electrode 326 is formed on the top surface (the second major surface) of the second mirror region. An electrode 328 is also formed on the bottom side of the gallium arsenide substrate 316.

The method of making the optoelectronic device according to the present invention includes the steps of: forming a first region 302 on a first substrate 316, the first region being comprised of a first material lattice-matched to the first substrate, the first material having a first lattice parameter; forming a second region 306 on the first major surface of a second substrate 332, the second region being comprised of a second material lattice-matched to the second substrate, the second material having a second lattice parameter different than the first lattice parameter; forming a third region 304 on the first major surface of a third substrate 336, the third region being comprised of a third material having a lattice parameter different than the second lattice parameter; fusing the first region 302 to the second region 306 and removing the second substrate 332; and fusing the second region 306 to the third region 304 and removing the third substrate 336. Typically, the lattice-matched materials have a less than 0.1% difference to the substrate to which they are matched. Typically, the lattice parameter of the second region which has a lattice parameter different than the lattice parameter of the first and third materials has a difference of between 1 to 5% as compared to the lattice parameter of the first and third regions.

In the case of a vertical cavity surface emitting laser the first and third regions 302, 304 are highly reflective mirror regions and the second region 306 is an active region. Specifically, the method of making the vertical cavity surface emitting laser 300, includes the steps of: forming the first mirror region 302 on a substrate 316, the first mirror region 302 being comprised of a first material; forming an active region 306 on the first major surface 312 of the first mirror region 302, the active region 306 comprised of a second material different from the first material; forming a second mirror region 304; fusing the first mirror region 302 to the active region 306; and fusing the second mirror region 304 to the active region 306.

A step in forming the VCSEL 300 is forming a first mirror region 302 on a first surface 330 of a substrate 316. In the preferred embodiment the first mirror region 302 is a Bragg mirror comprised of alternating pairs of n-doped GaAs/AlAs quarter-wave layers epitaxially grown on a substrate 316. The interface between the quarter-wave layers may be graded. The grading smooths any heterojunction band transition at the GaAs/AlAs interface. The doping level is typically $1 \times 10^{18}/cm^3$ in uniform regions and approximately $3 \times 10^{18}/cm^3$ in the graded regions. Reflectivity of the first mirror region 302 is approximately 98.9%. For simplicity, only a few of the alternating pairs of layers are shown in FIGS. 3 and 4. Further, the VCSEL structures shown in FIGS. 3 and 4 are not to scale.

A further step in forming of a VCSEL 300 is formation of the gain region 306. The gain region 306 is formed from a second material lattice matched to a substrate different than the first material from which the first mirror region 302 is formed. In the preferred embodiment, the second substrate material is indium phosphide (InP). The gain region 306 is typically comprised of a n-cladding layer 318, a light generation region 317, and a p-cladding layer 320.

Figure 4A:
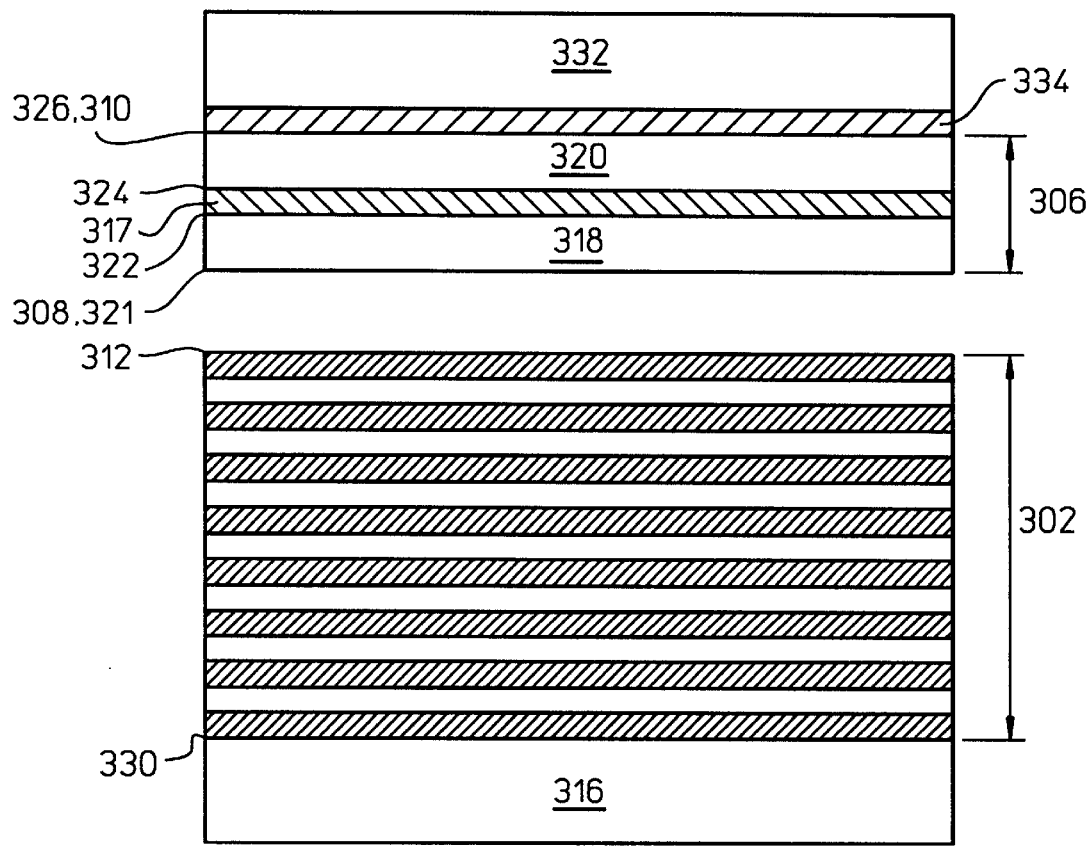
FIGS. 4A–C show a cross-sectional view of the preferred method steps required for formation of the VCSEL shown in FIG. 3A.
Figure 4B:
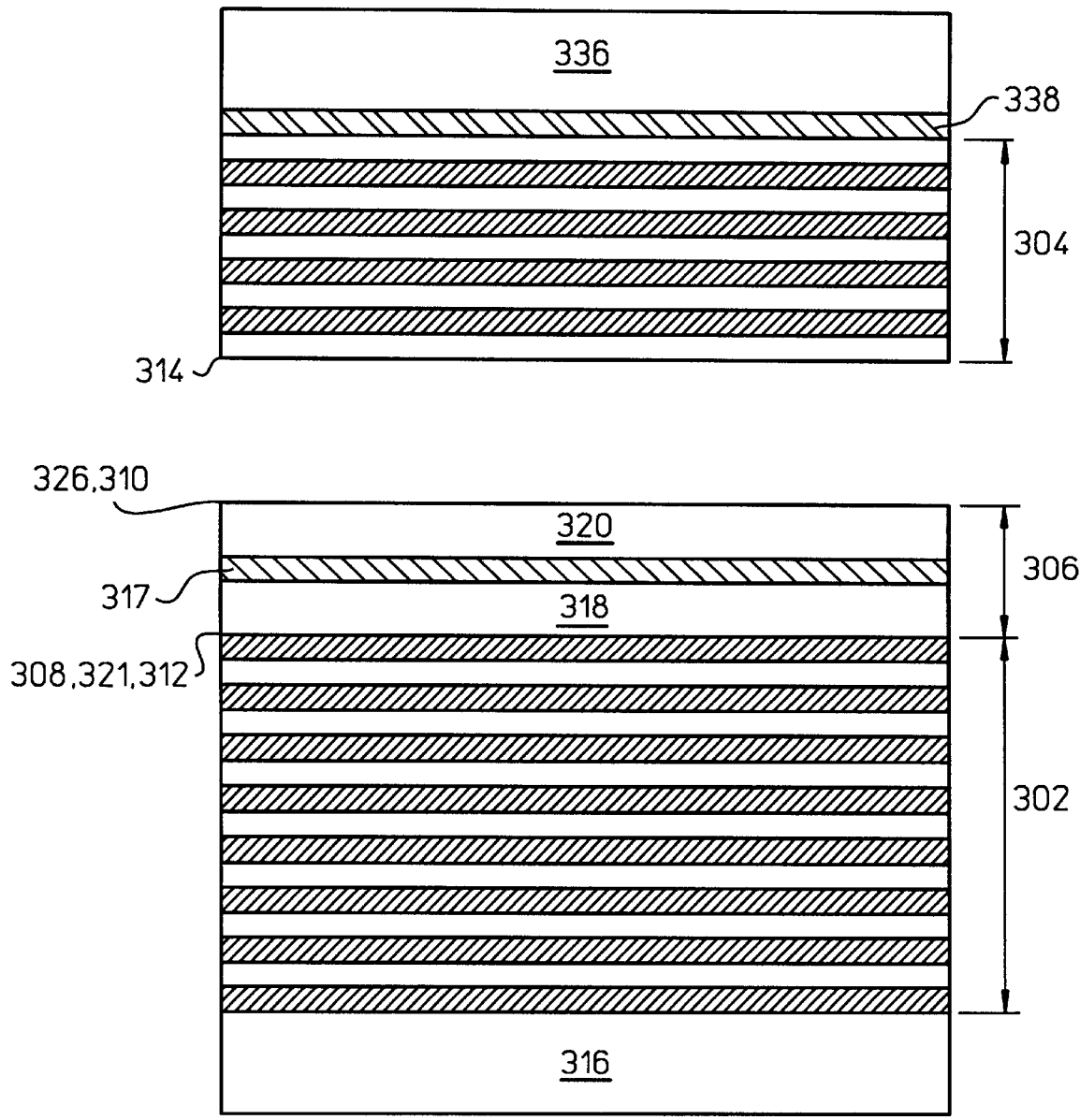
Figure 4C:
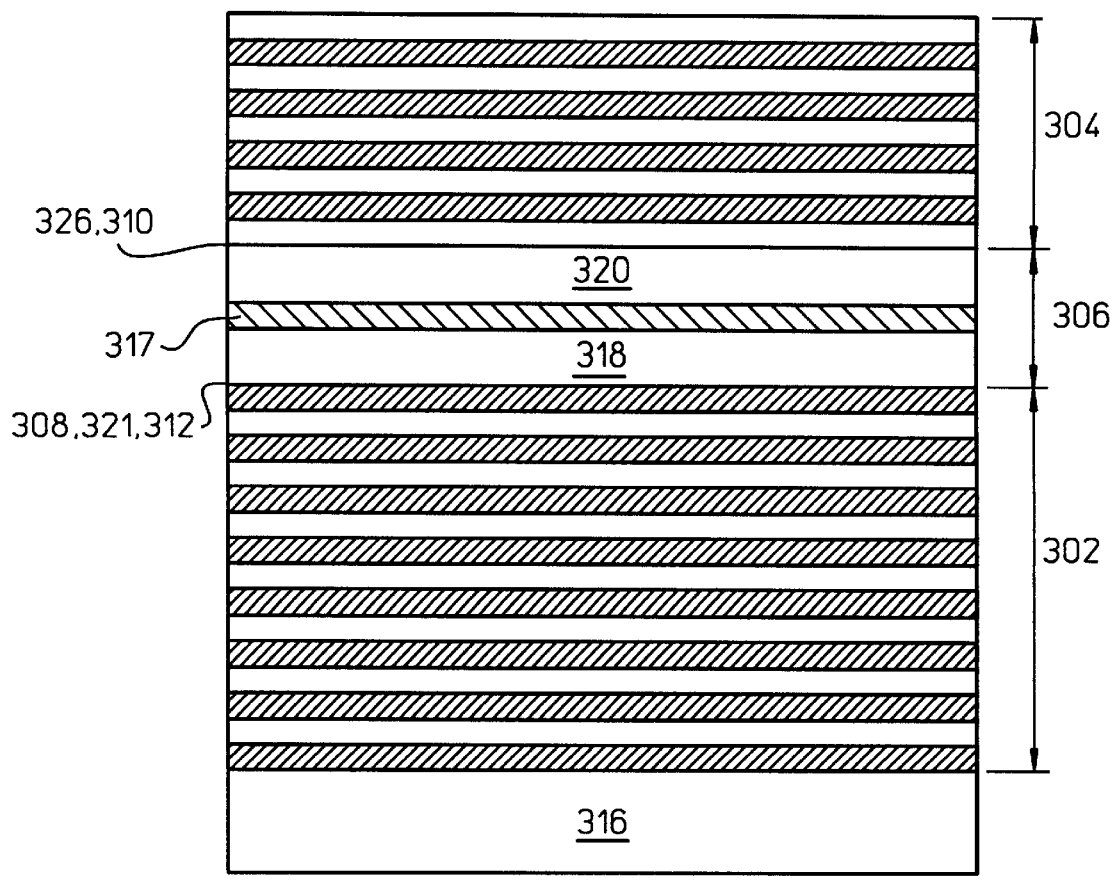

Referring to FIGS. 4A–4C shows a series of cross-sectional view of the method steps required for formation of the VCSEL. In the preferred embodiment, the gain region 306 is formed on a substrate 332 after the formation of an etch stop layer 334. The etch stop layer 334 is positioned between the gain region 306 and the substrate 332. The etch stop layer 334, allows the indium phosphide substrate 332 to be removed in a subsequent step without removing the gain region 306.

After formation of the etch stop layer 334 on the substrate 332, a p-cladding layer 320 is formed on the etch stop layer 334. The p-cladding layer 320 is typically comprised of indium phosphide having a thickness of approximately 500 nanometers and p-doped to a concentration of approximately $1 \times 10^{18}$ atoms/cm$^3$.

After growth of the p-cladding layer 320, a light generation region 317 is formed. The light generation region 317 includes at least one layer typically comprised of InGaAsP and grown to a thickness between 10 angstroms and 0.2 microns. The layer is typically doped to a concentration of $2 \times 10^{17}$ atoms/cm$^3$ and has an emission wavelength near 1.3 or 1.55 microns. Next, a n-cladding layer 318 is grown on the top surface of the light generation region 317. The n-cladding layer 318 is typically comprised of indium phosphide having a thickness of less than four emission wavelengths of the cladding material and a dopant concentration of approximately $1 \times 10^{18}$ atoms/cm$^3$.

After formation of the first mirror region 302 and the gain region 306, the first mirror region 302 is fused to the gain region 306. FIGS. 4A–C show a cross-sectional view of the preferred method steps required for formation of the VCSEL shown in FIG. 3. FIG. 4A shows the resultant VCSEL structure after the steps of forming of the first mirror region 302 on a substrate 316 and formation of the gain region 306 on a substrate 332, but before the step of fusing the gain region 306 to the first mirror region 302.

In the embodiment shown in FIG. 4A and 4B, the n-cladding layer 318 of the active region 306 is fused to the n-type first mirror region 302 before fusion of the p-type cladding layer 320 to the p-type second mirror region 304. Alternatively, the p-type cladding layer 320 may be fused to the p-type second mirror region 304 before fusion of the n-type cladding region 318 to the n-type mirror region 302. In this alternative process, the n-type cladding layer 318 is formed on the surface of the etch stop layer 332, followed by formation of the light generation region 317, followed by formation of the p-cladding layer 320. This exposes the p-cladding layer 320 for fusing.

Fusing is defined as forming covalent bonds between two dissimilar materials. Fusing the GaAs/AlAs first mirror region 302 and the InP gain region 306 into a single hybrid solid is performed using a technique called wafer fusion (or wafer bonding). In the present invention, wafer fusion is performed by aligning the first major surface 321 of the first mirror region 302 to the first major surface 308 of the gain region 306, and placing the two surfaces 321, 308 in physical contact at a temperature of approximately 650° C. for approximately 30 minutes. The fusion temperature (in this case approximately 650° C.) is the temperature at which mass transport of atoms starts to occur for either the first mirror material or the gain region. In the preferred embodiment, the first mirror region 302 and the gain region 306 are placed in a hydrogen ambient to help to remove oxide at the prepared surfaces.

After the two structures 302 and 306 have been fused together, the indium phosphide substrate 332 upon which the gain region 306 has been formed is removed. The indium phosphide substrate 332 is removed by exposing the substrate 332 to a wet chemical etchant such as HCl:H$_2$O which reacts with the indium phosphide substrate until reaching the InGaAs(P) etch stop layer 334. Next, the etch stop layer 334 is selectively removed exposing the active region 304. Typically, this active region surface is InP which is preferred over the etch stop material for the bonding process.

Some additional advantages to the double bonding process concern the residual stress profile and the ease of fabrication. Since the bonding process occurs at elevated temperature, about 650 degrees Celsius, there is a residual stress in the structure at room temperature. This is the result of the different thermal expansion coefficients of the two materials joined in the bonding process. This residual stress can be a problem if it intersects an exposed surface of the material as any small crack can be quickly propagated through the material causing wafer breakage. If the first and third materials are the same or at least have the closely matched thermal expansion coefficients, then the residual stress is confined to the interior of the structure making it less susceptible to breakage. If the first and third materials are GaAs or materials lattice-matched to GaAs, then the processes developed earlier for device fabrication of GaAs devices will also work on this double-bonded structure. For the purposes of contact formation and current isolation, no new processing technology needs to be developed.

A further step in the formation of the vertical cavity surface emitting laser 300 is the formation of a second mirror region 304. Although not required, in the preferred embodiment the second mirror region 304 is comprised of the same material as the first mirror region 302, in this case gallium arsenide. The second mirror region 304 is formed on the surface of a gallium arsenide substrate 336 in a manner similar to the formation of the first mirror region 302. However, because the gallium arsenide substrate 336 will be removed in a subsequent step, an etch stop layer 338 is formed between the substrate 336 and the second mirror region 304. Further, the second mirror region 304 is p-doped so that it has a conductivity type opposite to that of the first mirror region 302.

Similar to the first mirror region 302, the second mirror region 304 is typically comprised of alternating GaAs/AlAs quarter-wave epitaxially grown layers. Typically the mirror is p-type and number of alternating quarter-wave pairs is in the range of 15 to 30. The doping and grading of the alternating layers is typically in the same ranges as the n-doped GaAs/AlAs alternating layers in the n-doped first mirror region 302.

Since the overall length of the resonant cavity formed between the two mirror regions 302 and 304 must be precisely controlled, the mirror region 304 may be designed to accommodate any inaccuracies in the growth of either the first mirror region 302 or the active region 306. This is accomplished by measuring the reflectance spectrum of the fused active region 306 and mirror region 302 with the active region substrate 332 removed. The structure of regions 302 and 306 can be deduced from this measurement and any inaccuracies adjusted for by changing the thickness of key layers in the second mirror region 304. The ability to make such an adjustment improves the probability of successfully achieving the proper cavity length.

After formation of the second mirror region 304 and formation of the gain region 306, the second mirror region 304 is fused to the gain region 306. Typically, the second mirror region 304 is fused to the gain region 306 after fusion of the gain region 306 to the first mirror region 302. Referring to FIG. 4B shows the VCSEL structure after the step of fusing the first mirror region 302 to the gain region 306 and removing the substrate 332 but before the step of fusing the second mirror region 304 to the gain region. Before fusion, the second mirror region 304 and the gain region 306 are positioned so that the first major surface 314 of the second mirror region 304 faces the second major surface 310 of the gain region 306.

Fusion of the second mirror region is similar to the previously described fusion of the first mirror region to the gain region. Typically wafer fusion occurs by aligning the second mirror region 304 and gain region 306 and then placing them into physical contact for approximately 650° C. for 30 minutes in a hydrogen ambient. After fusion of the second mirror region 304 to the gain region 306, the gallium arsenide substrate 336 is removed. In this case, since the substrate 336 is removed so that only the p-doped second mirror region 304 remains, it is immaterial whether the substrate 336 upon which the second mirror region 336 is formed is n-type or p-type.

Typically the gallium arsenide substrate 336 is removed by exposing the substrate 336 to a wet chemical etchant such as $NH_4OH:H_2O_2:H_2O$. The etchant removes the substrate and stops on an etch stop layer 338, typically comprised of aluminum arsenide. The aluminum arsenide layer is then selectively removed exposing the second major surface 340 of the second mirror region 304. FIG. 4C shows the resultant VCSEL structure after the steps of (1) fusing the first mirror region 302 to the gain region 306 and (2) fusing the second mirror region 304 to the gain region 306.

Figure 3A:
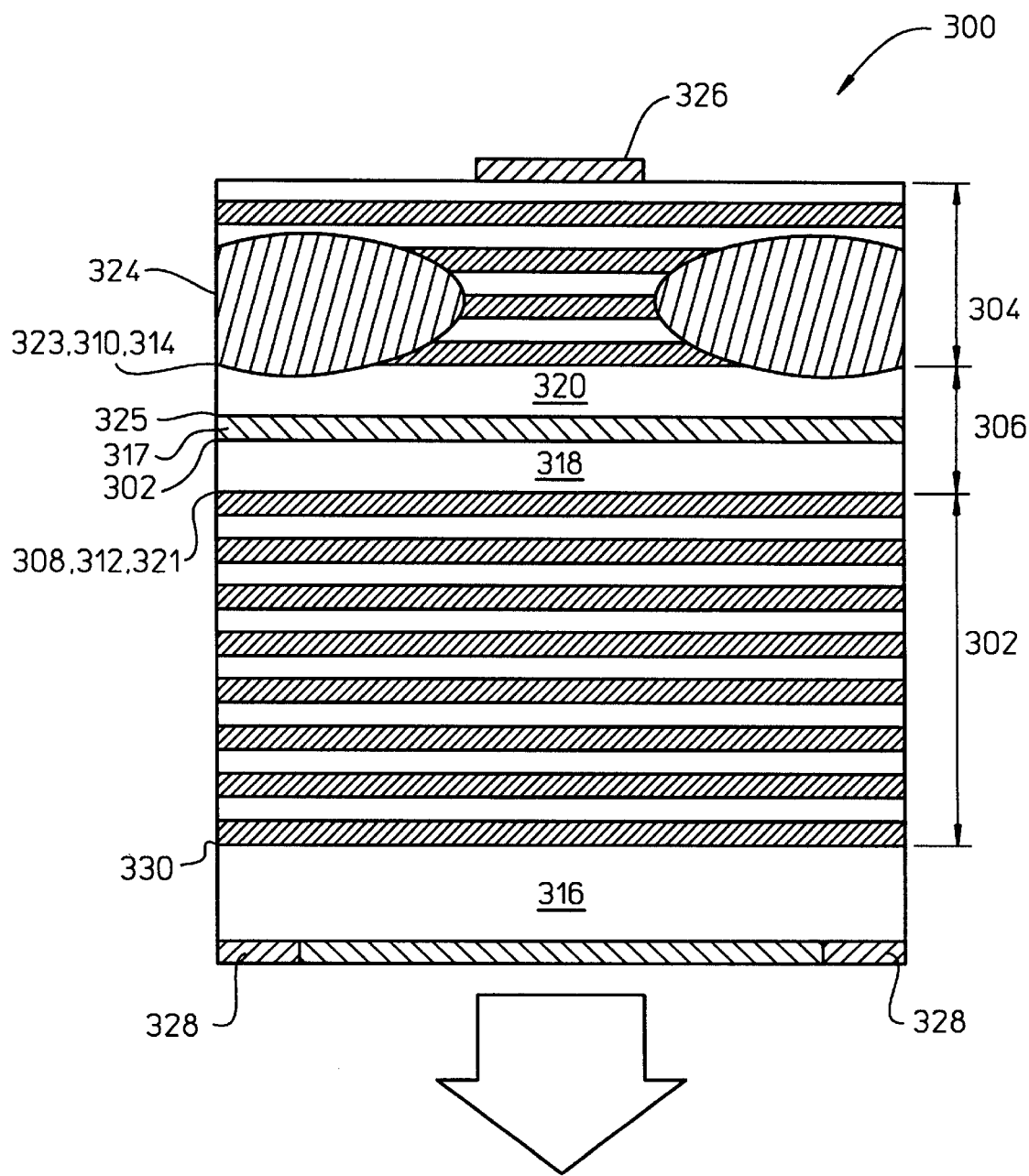
FIG. 3A shows a bottom emitting VCSEL according to one embodiment of the present invention.
Figure 3B:
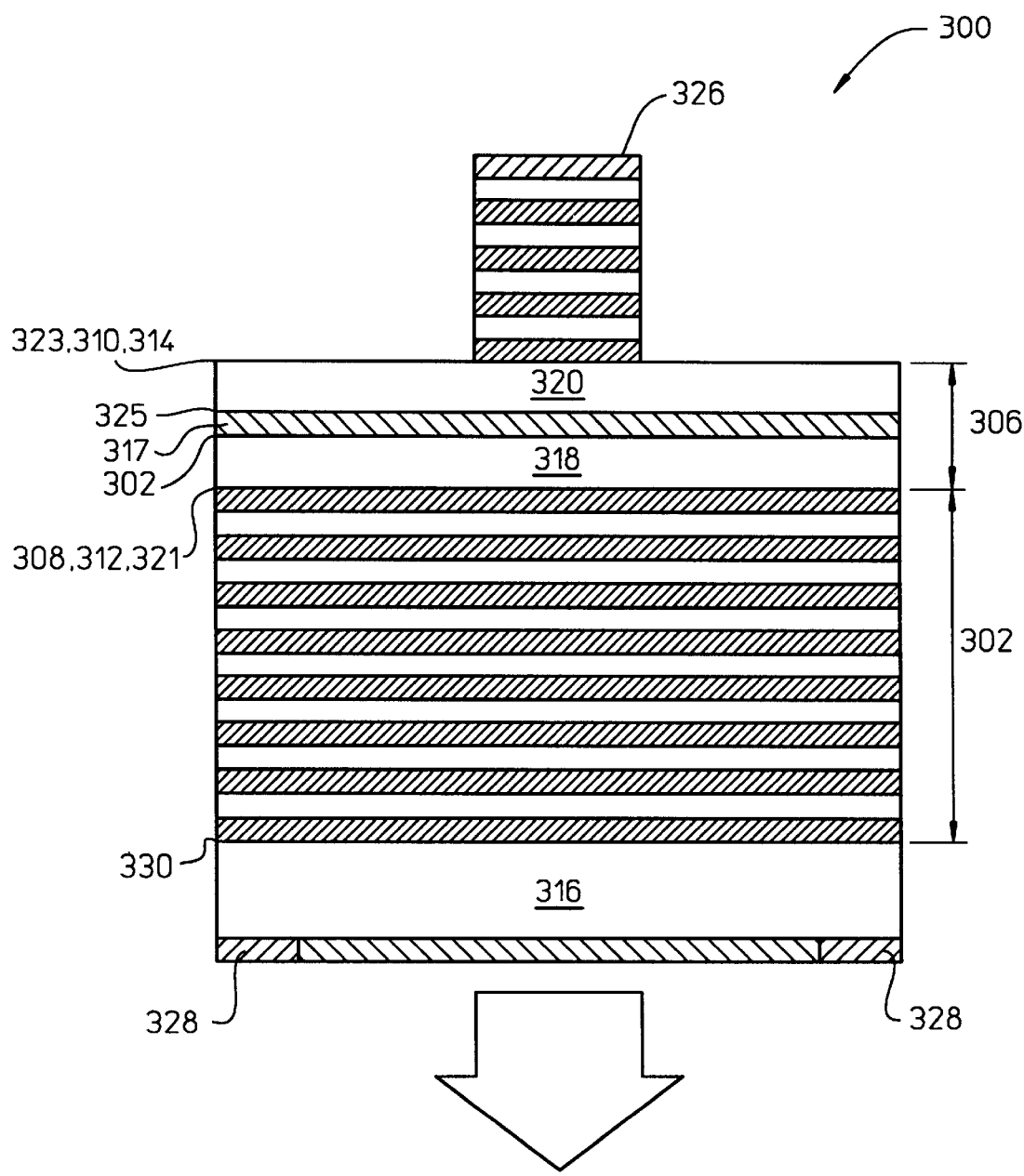
FIG. 3B shows a bottom emitting VCSEL according to an alternative embodiment of the present invention.
Figure 3C:
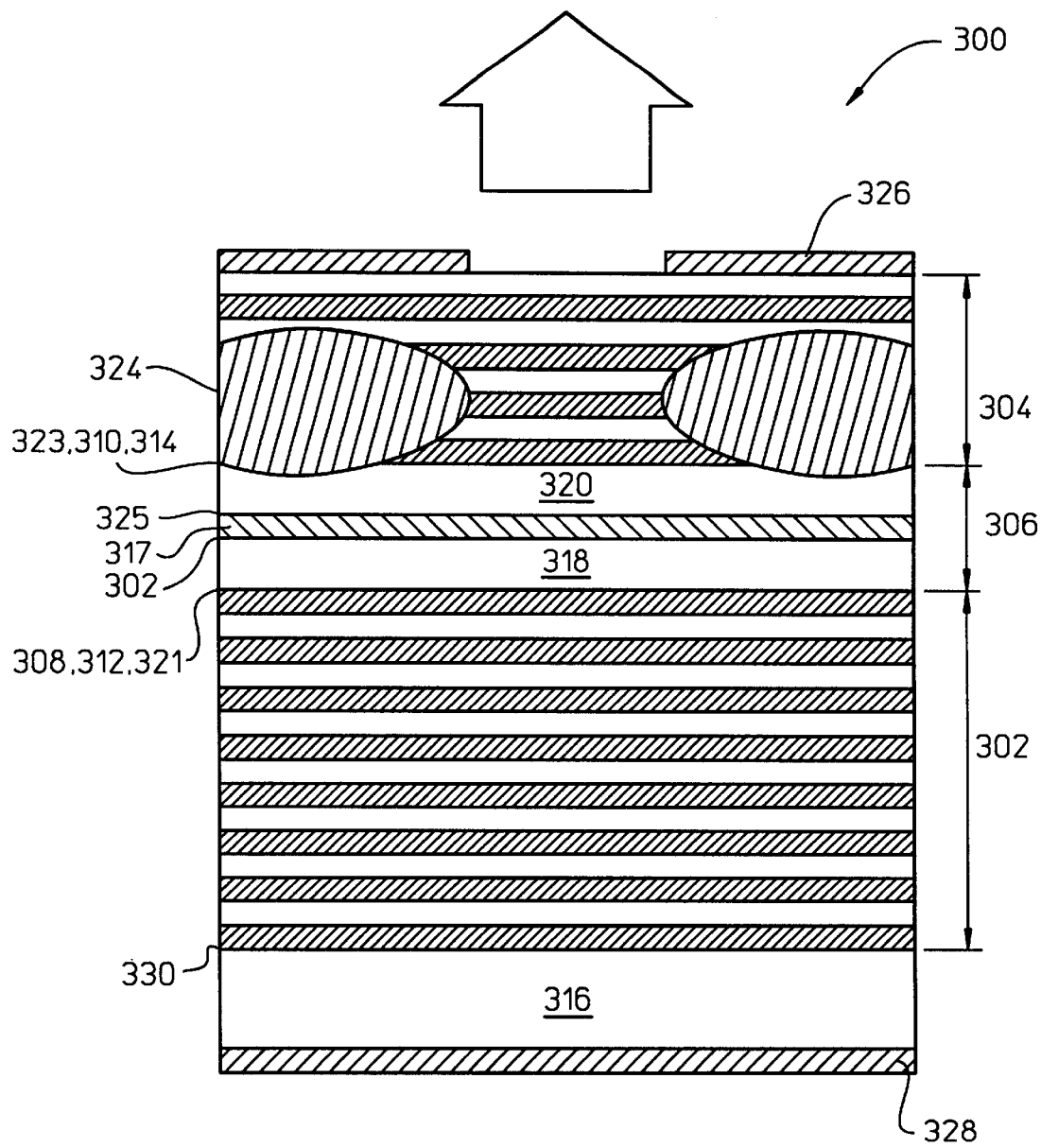
FIG. 3C shows a top emitting VCSEL according to one embodiment of the present invention.
Figure 3D:
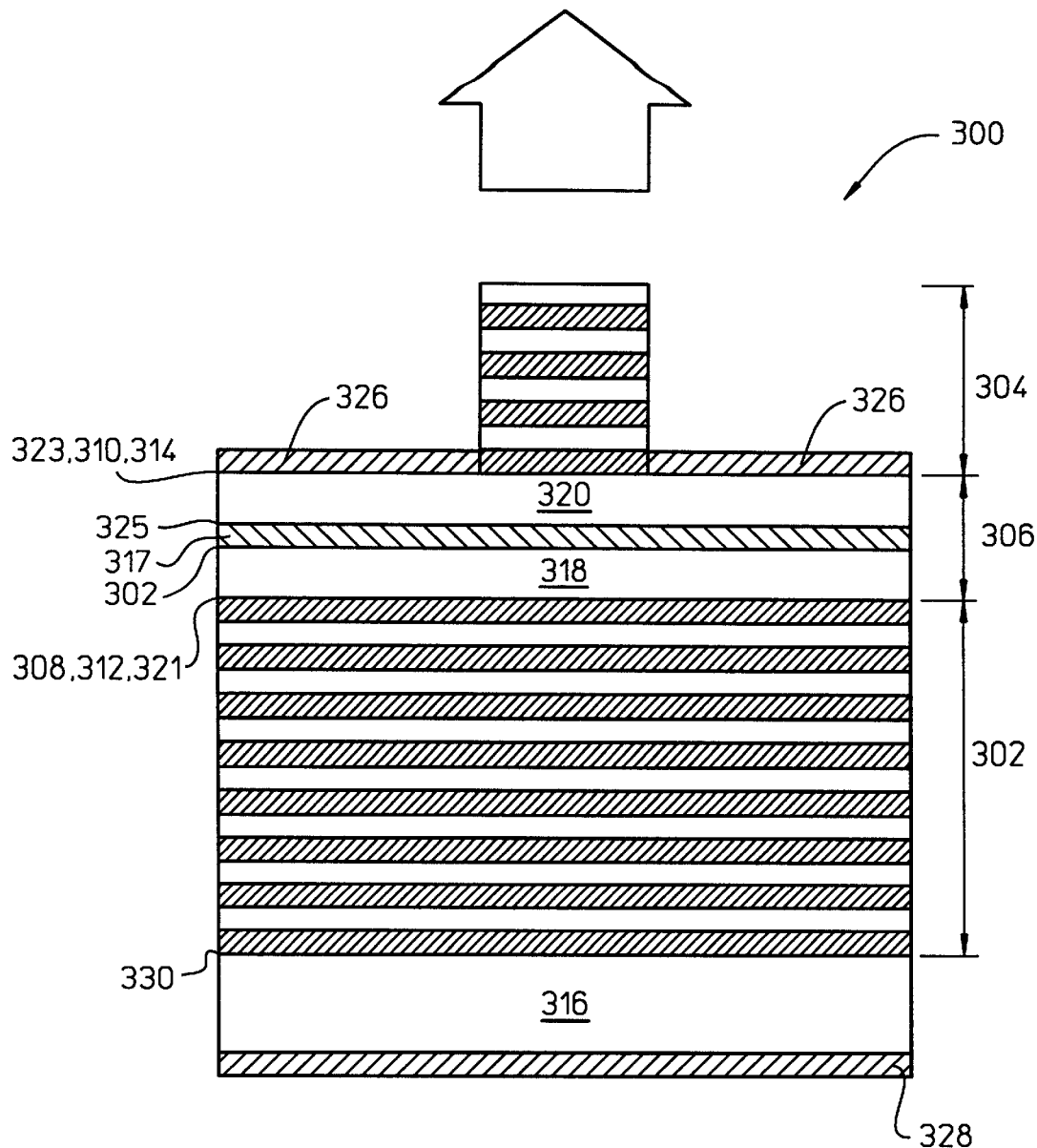
FIG. 3D shows a top emitting VCSEL according to an alternative embodiment of the present invention.

The removal of the substrate 336 is typically followed by formation of proton or mesa isolation regions and electrode or contact 326, 328 formation using techniques well known in the art. The VCSEL embodiments shown in FIG. 3A and 3C include proton isolation regions 324 formed after formation of the mirror region 304. Typically, the proton isolation regions 324 are formed by forming a mask on the surface of mirror region 304 and implanting H+ ions to form proton isolation regions 304. In contrast, the mesa isolation regions as seen in FIGS. 3B and 3D are formed by etching. FIG. 3B shows a bottom emitting VCSEL according to an alternative embodiment of the present invention. The mesa isolation regions are formed by forming a mask on the surface of mirror region 304 and etching a predetermined distance into the mirror region 304 and/or the active region 306.

After either the formation of the proton isolation region 324 or the formation of mesa isolation regions, contacts are formed using techniques well known in the art. Contact placement is dependent in part on whether the VCSEL is a top emitting laser or a bottom emitting laser. FIGS. 3A and 3B show bottom emitting VCSELs while FIGS. 3C and 3D show a top emitting VCSELs. Typically, electrodes 326 and 328 are formed of gold or gold alloys.

It is understood that the above description is intended to be illustrative and not restrictive. By way of example, the step of fusing the gain region to the second mirror region may occur before the step of fusing the gain region to the first mirror region. Further, the number of Bragg mirrors in the mirror regions, the dopant concentration levels and the materials used in the first mirror region, the second mirror region and the gain region may vary dependent upon the desired laser characteristics. The process of dual wafer bonding is applicable to other light emitting devices including but not limited to resonant cavity LEDs, surface normal tunable detectors, and resonant photodiodes. The invention should therefore not be determined with reference to the above description, but instead should be determined with reference to the appended claims, along with the full scope of equivalent to which such claims are entitled.

What is claimed is:

1. A method of making an optoelectronic device, including the steps of:

forming a first region on a first substrate, the first region being comprised of a first material lattice-matched to the first substrate, the first material having a first lattice parameter;

forming a second region on the first major surface of a second substrate, the second region being comprised of a second material lattice-matched to the second substrate, the second material having a second lattice parameter different than the first lattice parameter;

forming a third region on the first major surface of a third substrate, the third region being comprised of a third material having a lattice parameter different than the second lattice parameter;

fusing the first region to the second region and removing the second substrate to form a first structure; and fusing the second region of the first structure to the third region and removing the third substrate.

2. The method recited in claim 1 wherein the step of fusing further includes the steps of aligning the surfaces to be fused; placing the surfaces to be fused in direct physical contact; increasing the temperature to the temperature at which mass transport of atoms begins to occur.

3. The method recited in claim 1 wherein the first region and third regions are mirror regions and the second region is an active region.

4. The method recited in claim 3 wherein the optoelectronic device is a VCSEL.

5. The method recited in claim 3 wherein the optoelectronic device is a resonant cavity LED.

6. The method recited in claim 3 wherein the optoelectronic device is a resonant cavity photodiode.

7. The method recited in claim 1 wherein an etch stop layer is positioned between the active region and the second substrate and the second substrate is removed by exposing the substrate to an etchant which selectively removes the second substrate but not the etch stop layer.

8. The method recited in claim 1 further including the steps of measuring the reflectance spectrum of the fused first region and second region, wherein the step of measuring the reflectance spectrum occurs after the step of removing the second substrate but before the step of fusing the second region to the third region.

9. The method recited in claim 8 further including the step of determining the thickness of the third region based on the measurement of the reflectance spectrum of the fused first and second region.

10. A method for forming an optoelectronic device comprising the steps of:

selecting a first material having properties desirable for forming a mirror region having the desired reflectivity;

providing a first substrate, the first material being lattice-matched to the first substrate;

forming a first mirror region on the first substrate;

selecting a second material having properties desirable for forming an active region, the second material having the desired light emission characteristics;

providing a second substrate, the second material being lattice-matched to the second substrate;

forming an active region on the second substrate;

selecting a third material having properties desirable for forming a mirror region having the desired reflectivity;

providing a third substrate, the third material being lattice-matched to the third substrate;

forming a second mirror region on the third substrate;

fusing the first mirror region to the active region and removing the second substrate to form a first structure; and fusing the second mirror region of the first structure to the active region and removing the third substrate.

* * * * *